(12) United States Patent
Derderian et al.

(10) Patent No.: US 7,329,615 B2
(45) Date of Patent: Feb. 12, 2008

(54) ATOMIC LAYER DEPOSITION METHOD OF FORMING AN OXIDE COMPRISING LAYER ON A SUBSTRATE

(75) Inventors: Garo J. Derderian, Boise, ID (US); Demetrius Sarigiannis, Boise, ID (US); Shuang Meng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 350 days.

(21) Appl. No.: 11/200,275

(22) Filed: Aug. 9, 2005

(65) Prior Publication Data

US 2006/0029737 A1 Feb. 9, 2006

Related U.S. Application Data

(62) Division of application No. 10/783,242, filed on Feb. 19, 2004, now Pat. No. 7,067,438.

(51) Int. Cl.
*H04L 21/31* (2006.01)
*H04L 21/469* (2006.01)

(52) U.S. Cl. .................. 438/778; 438/681; 438/785; 257/E21.002

(58) Field of Classification Search .............. 438/758, 438/681, 785, 763, 778, 253, 396
See application file for complete search history.

(56) References Cited

U.S. PATENT DOCUMENTS

| 4,949,671 | A | 8/1990 | Davis et al. |
| 6,403,414 | B2 | 6/2002 | Marsh |
| 6,451,692 | B1 | 9/2002 | Derderian et al. |
| 6,454,912 | B1 | 9/2002 | Ahn et al. |
| 6,495,458 | B2 | 12/2002 | Marsh |
| 6,534,357 | B1 | 3/2003 | Basceri et al. |
| 6,596,583 | B2 | 7/2003 | Agarwal et al. |
| 6,613,656 | B2 | 9/2003 | Li |
| 2003/0207540 | A1 | 11/2003 | Ahn et al. |
| 2003/0207593 | A1 | 11/2003 | Derderian et al. |
| 2003/0227033 | A1 | 12/2003 | Ahn et al. |
| 2003/0232511 | A1* | 12/2003 | Metzner et al. ............. 438/785 |
| 2004/0152304 | A1* | 8/2004 | Sarigiannis et al. ........ 438/680 |

* cited by examiner

*Primary Examiner*—Alexander Ghyka
(74) *Attorney, Agent, or Firm*—Wells St. John P.S.

(57) ABSTRACT

This invention includes atomic layer deposition methods of depositing oxide comprising layers on substrates. In one implementation, a substrate is positioned within a deposition chamber. A first species is chemisorbed to form a first species monolayer onto the substrate within the deposition chamber from a gaseous first precursor. The chemisorbed first species is contacted with a gaseous second precursor effective to react with the first species to form an oxide of a component of the first species monolayer. The contacting at least in part results from flowing $O_3$ to the deposition chamber, with the $O_3$ being at a temperature of at least 170° C. at a location where it is emitted into the deposition chamber. The chemisorbing and the contacting are successively repeated to form an oxide comprising layer on the substrate. Additional aspects and implementations are contemplated.

16 Claims, 4 Drawing Sheets

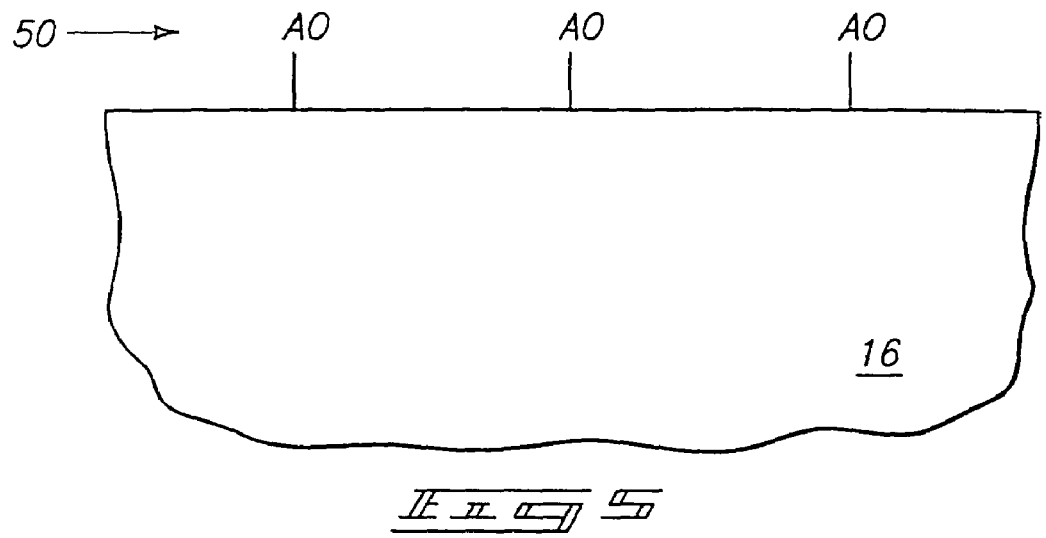
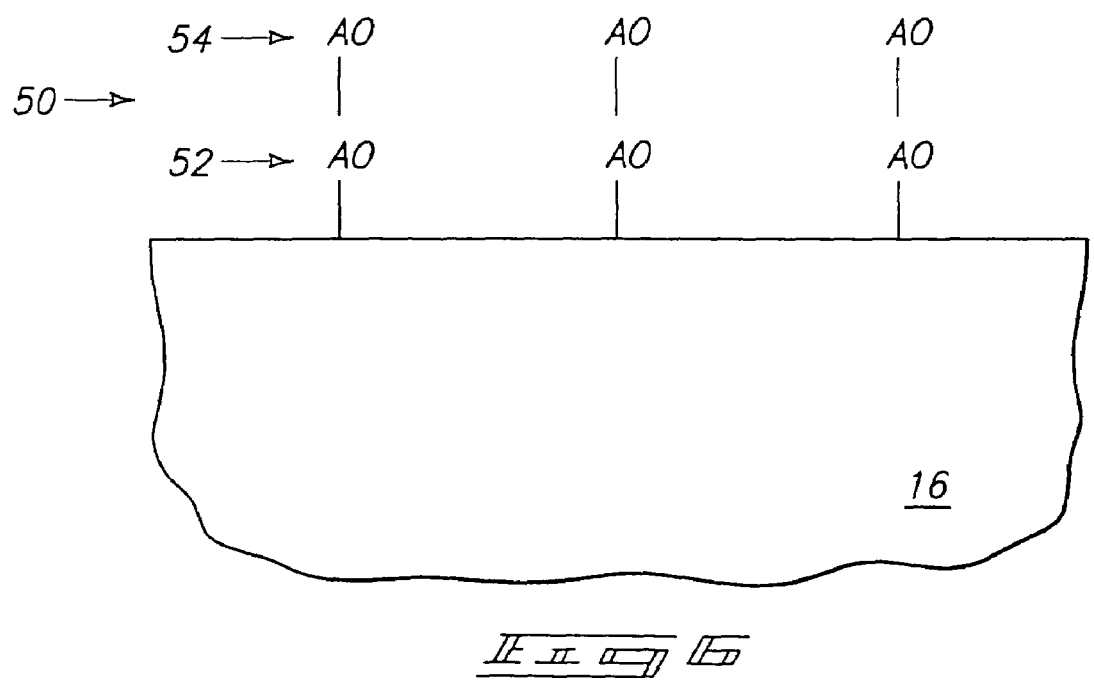

ATOMIC LAYER DEPOSITION METHOD OF FORMING AN OXIDE COMPRISING LAYER ON A SUBSTRATE

RELATED PATENT DATA

This patent resulted from a divisional application of U.S. patent application Ser. No. 10/783,242, filed Feb. 19, 2004 now U.S. Pat. No. 7,067,438, entitled "Atomic Layer Deposition Method of Forming an Oxide Comprising Layer on a Substrate", naming Garo J. Derderian, Demetrius Sarigiannis and Shuang Meng as inventors, the disclosure of which is incorporated by reference.

TECHNICAL FIELD

This invention relates to atomic layer deposition methods of forming oxide comprising layers on substrates

BACKGROUND OF THE INVENTION

Integrated circuits are typically formed on a semiconductor substrate such as a silicon wafer or other semiconductive material. In general, layers of various materials, which are one of semiconductive, conducting or insulating, are used to form the integrated circuits. By way of example, the various materials are doped, ion implanted, deposited, etched, grown, etc., using various processes. A continuing goal in semiconductor processing is to reduce the size of individual electronic components, thereby enabling smaller and denser integrated circuitry.

As semiconductor devices continue to shrink geometrically, such has had a tendency to result in greater shrinkage in the horizontal dimension than in the vertical dimension. In some instances, the vertical dimension increases. Regardless, the result is increased aspect ratios (height to width) of the devices, making it increasingly important to develop processes that enable materials to conformally deposit over the surfaces of high aspect ratio features. One such processing is atomic layer deposition, which involves the deposition of successive monolayers over a substrate within a deposition chamber typically maintained at subatmospheric pressure. With typical atomic layer deposition, successive monoatomic layers are adsorbed to a substrate and/or reacted with the outer layer on the substrate, typically by the successive feeding of different deposition precursors to the substrate surface.

One commonly used class of materials in the fabrication of integrated circuitry is oxides. Some oxides are electrically conductive, while other oxides are electrically insulative.

While the invention was motivated in addressing the above issues, it is in no way so limited. The invention is only limited by the accompanying claims as literally worded, without interpretative or other limiting reference to the specification, and in accordance with the doctrine of equivalents.

SUMMARY

The invention comprises atomic layer deposition methods of depositing oxide comprising layers on substrates. In one implementation, a substrate is positioned within a deposition chamber. A first species is chemisorbed to form a first species monolayer onto the substrate within the deposition chamber from a gaseous first precursor. The chemisorbed first species is contacted with a gaseous second precursor effective to react with the first species to form an oxide of a component of the first species monolayer. The contacting at least in part results from flowing $O_3$ to the deposition chamber, with the $O_3$ being at a temperature of at least 170° C. at a location where it is emitted into the deposition chamber. The chemisorbing and the contacting are successively repeated to form an oxide comprising layer on the substrate.

In one implementation, a substrate is positioned within a deposition chamber. A first species is chemisorbed to form a first species monolayer onto the substrate within the deposition chamber from a gaseous first precursor. The chemisorbed first species is contacted with a gaseous second precursor effective to react with the first species to form an oxide of a component of the first species monolayer. The contacting at least in part results from flowing $O_3$ to the deposition chamber. The $O_3$ forms $O^*$ proximate the substrate which reacts with the chemisorbed first species to form the oxide. The $O^*$ proximate the substrate is at a temperature which is greater than that of the first species monolayer on the substrate. The chemisorbing and the contacting are successively repeated to form an oxide comprising layer on the substrate.

In one implementation, a substrate is positioned within a deposition chamber. The deposition chamber comprises a substrate heater and at least one chamber wall heater. A first species is chemisorbed to form a first species monolayer onto the substrate within the deposition chamber from a gaseous first precursor. The chemisorbed first species is contacted with a gaseous second precursor effective to react with the first species to form an oxide of a component of the first species monolayer. The contacting at least in part results from flowing $O_3$ to the deposition chamber, with the substrate heater being at a temperature of at least 350° C. and the at least one wall heater being at a temperature of at least 350° C. during the contacting. The chemisorbing and the contacting are successively repeated to form an oxide comprising layer on the substrate.

Additional aspects and implementations are contemplated.

BRIEF DESCRIPTION OF THE DRAWINGS

Preferred embodiments of the invention are described below with reference to the following accompanying drawings.

FIG. 5 is a view of the FIG. 4 substrate at a processing step subsequent to that depicted by FIG. 4.

FIG. 6 is a view of the FIG. 5 substrate at a processing step subsequent to that depicted by FIG. 5.

DETAILED DESCRIPTION OF THE PREFERRED EMBODIMENTS

Figure 1:
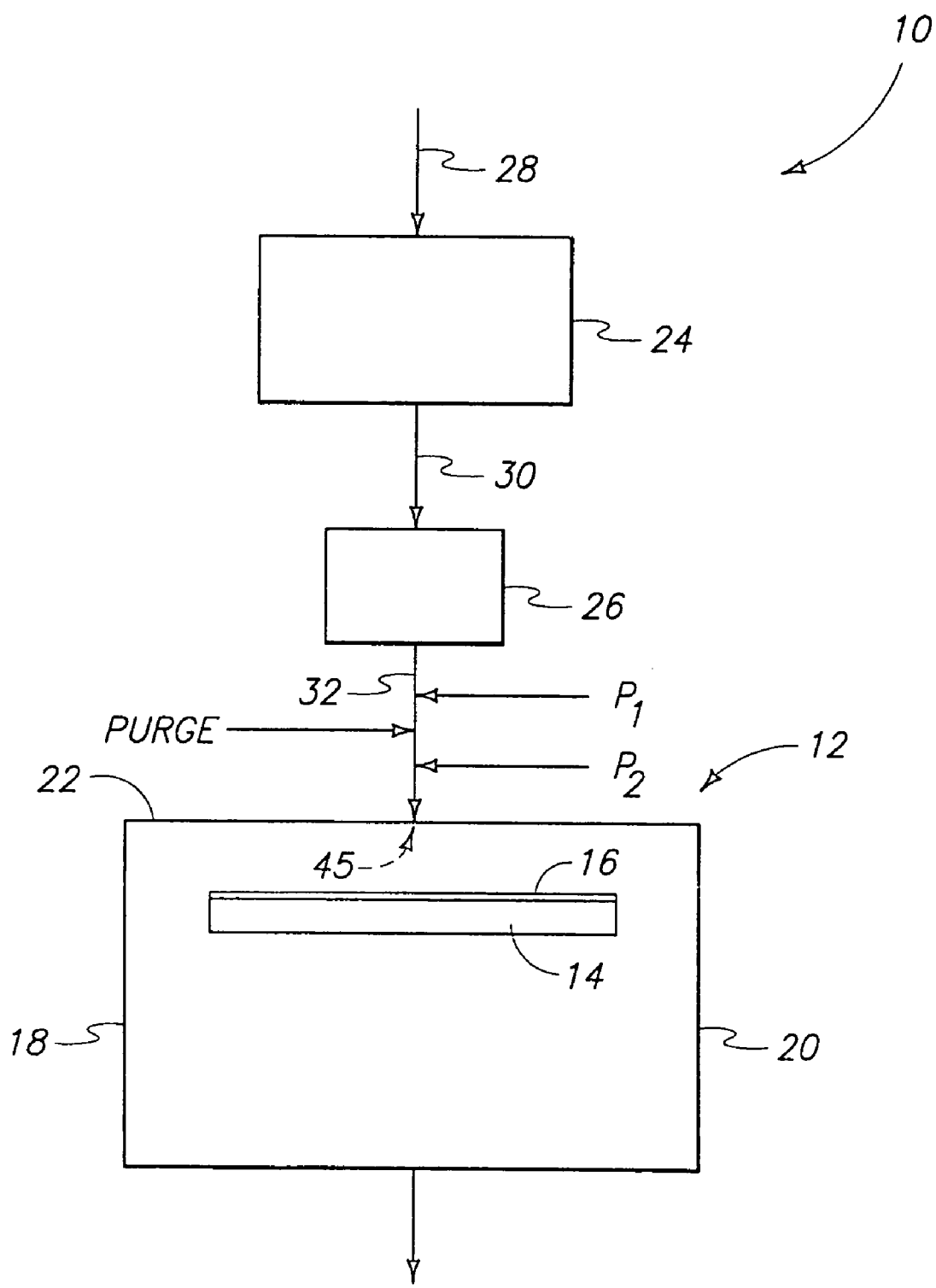
FIG. 1 is a diagrammatic schematic depiction of an atomic layer deposition system usable in accordance with an aspect of the invention.

This disclosure of the invention is submitted in furtherance of the constitutional purposes of the U.S. Patent Laws "to promote the progress of science and useful arts" (Article 1, Section 8).

The invention comprises atomic layer deposition methods of depositing oxides on substrates. Atomic layer depositing (ALD) typically involves formation of successive atomic layers on a substrate. Described in summary, ALD includes exposing an initial substrate to a first chemical species to accomplish chemisorbtion of the species onto the substrate. Theoretically, the chemisorbtion forms a monolayer that is uniformly one atom or molecule thick on the entire exposed initial substrate. In other words, a saturated monolayer is preferably formed. Practically, chemisorbtion might not occur on all portions or completely over the desired substrate surfaces. Nevertheless, such an imperfect monolayer is still considered a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include nitrogen, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. Further, local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The problem which motivated the invention resulted from an ALD process of depositing an aluminum oxide comprising layer from trimethyl aluminum and ozone precursors. Such was resulting in the center portion of the wafer or substrate being deposited upon having poorer film quality and a lower thickness of the deposited oxide. This was unexpected, as the ozone and other precursor feeds to the chamber direct the precursors to the very center of the substrate, whereupon such would presumably spread out across the wafer surface. Accordingly with ozone as the reactive species in ultimately forming the oxide, one would expect a thicker and denser oxide deposition at the center of the substrate as opposed to at its edges, presumably because the ozone concentration would likely be greater at the center versus the edges of the wafer. Further, it was believed that one would want to keep the ozone temperature as fed to the substrate comparatively low, as ozone half-life decreases significantly with increasing temperature and at increasing pressure. For example, at 1 Torr, ozone half-life changes from approximately 21 years at room temperature to 76 seconds at 250° C. to 0.75 seconds at 400° C. Similarly, at 250° C., ozone half-life is approximately 21 hours at 1 mTorr, 76 seconds at 1 Torr, and 0.78 seconds at 100 Torr. Accordingly intuitively, one would seemingly tend to want to keep temperatures and pressures low to keep the ozone concentration at the substrate surface suitably high to effect reaction.

However, it has been determined that O* (resulting from the reaction of $O_3$ to $O_2$+O*) is the likely reactive species forming the oxide. Software modeling of the O* concentration in the system across the substrate corresponds precisely to the thickness pattern of the deposited oxide layer. It has also been determined that the O* concentration can be increased by increasing temperature of the $O_3$. Conventional prior art ozone feed streams typically result from an ozone generator to which oxygen is fed to convert a portion of that stream to ozone. This generator is typically located at least from 20 to 30 feet from the deposition chamber. Accordingly, the ozone typically flows through uninsulated pipe and enters the chamber probably at a temperature of from about 25° C. to 30° C.

Consider a first exemplary embodiment system 10 in FIG. 1 usable in accordance with methodical aspects of the invention of atomic layer depositing an oxide comprising layer on a substrate. FIG. 1 is only diagrammatic and schematic, with any equipment being utilizable to practice methodical aspects of the invention, and whether such equipment is existing or yet-to-be developed. System 10 comprises a deposition chamber 12 which, in the preferred embodiment, comprises a substrate heater and support 14. A substrate 16 to be deposited upon is positioned within deposition chamber 12 in the illustrated embodiment over substrate heater/support 14. Deposition chamber 12 includes chamber walls 18, 20 and 22, with wall 22 in the depicted example comprising a lid, and walls 18 and 20 comprising sidewalls. In one preferred embodiment in practice of the method, at least one of such chamber walls 18, 20 and 22 is heated by a suitable external heat source for controlling the temperature thereof.

Figure 2:
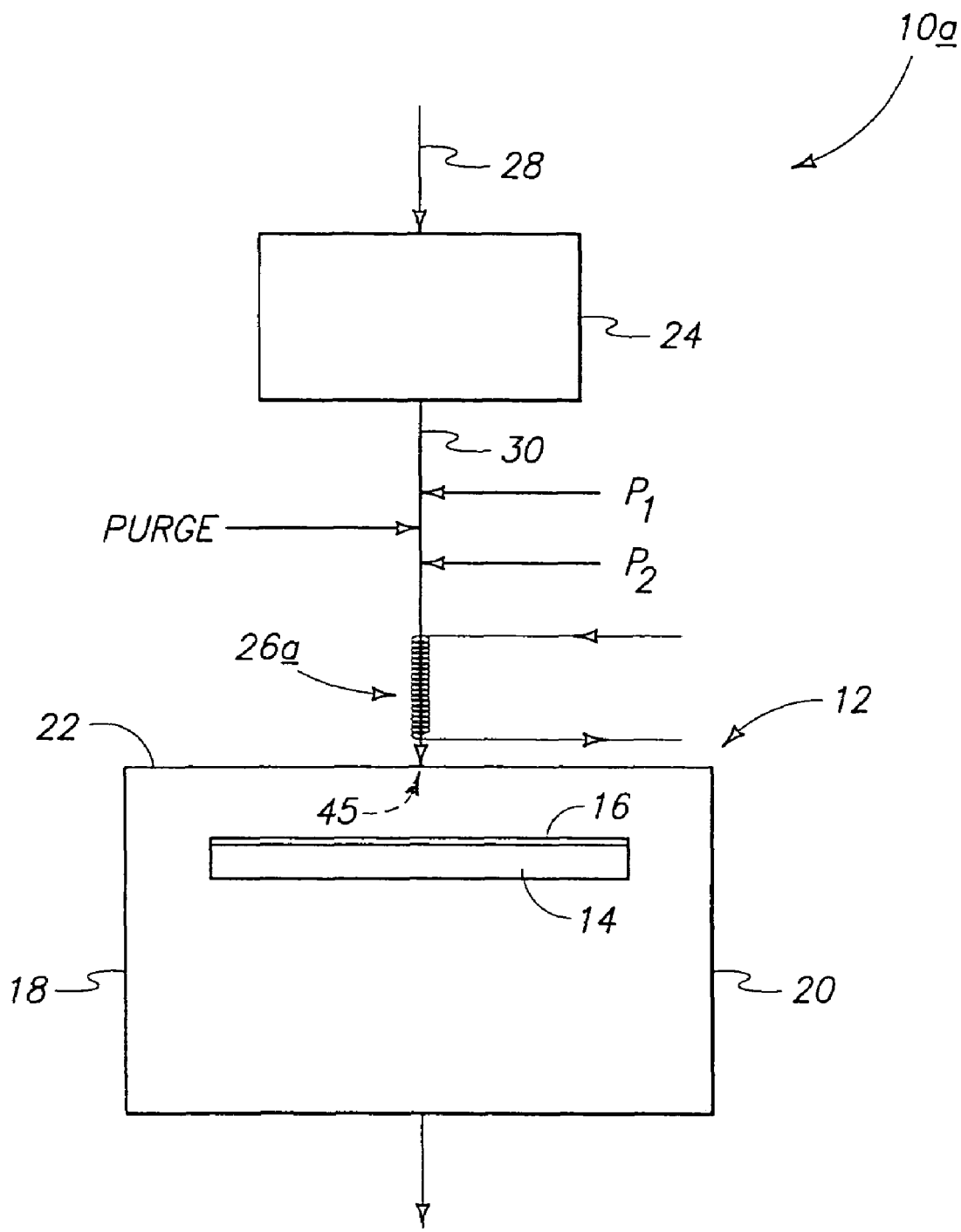
FIG. 2 is a diagrammatic schematic depiction of another atomic layer deposition system usable in accordance with an aspect of the invention.

System 10 is diagrammatically depicted as including an ozone generator 24 and a downstream heater 26. A conduit 28 is diagrammatically depicted as feeding, for example $O_2$, to ozone generator 24 for generating at least some $O_3$ therefrom. A conduit 30 feeds from ozone generator 24 to heater 26, and a conduit 32 feeds from heater 26 to deposition chamber 12. Additional precursor feed streams $P_1$ and $P_2$, as well as a purge gas line, are shown feeding to conduit 32 intermediate heater 26 and deposition chamber 12. Of course, any conceivable other feeding of any purge gases or precursors to the chamber is contemplated, for example by feeding the purge gas or certain precursors directly to the chamber apart from ozone generation and heating, as well as into or through conduit 28 and conduit 30. For example and by way of example only, FIG. 2 depicts an alternate system 10a, wherein like components are designated with the same numerals, with differences being indicated with the suffix "a". System 10a depicts a heater 26a in the form of a heating coil wrapped around conduit 30, and with exemplary precursor inlet streams $P_1$ and $P_2$ as well as a purge gas inlet depicted as intersecting conduit 30 above heater 26a. Again, any conceivable alternate construction whether existing or yet-to-be developed is contemplated. Further and by way of example only, the ozone and any precursor stream might feed to a mixing gas box immediately prior to injection into chamber 12, and might also feed to or through a showerhead within deposition chamber 12. Further by way of example only, where ozone is fed to the chamber from a conduit, such conduit might be heated by a suitable external heat source immediately at the location where it joins with the deposition chamber, or alternately by way of example only, be completely void of any external heat source at a location where it immediately enters the chamber. In one preferred implementation, the conduit is void of any external heat source at a location from where it enters the chamber to no greater than one foot upstream from the chamber.

Figure 3:
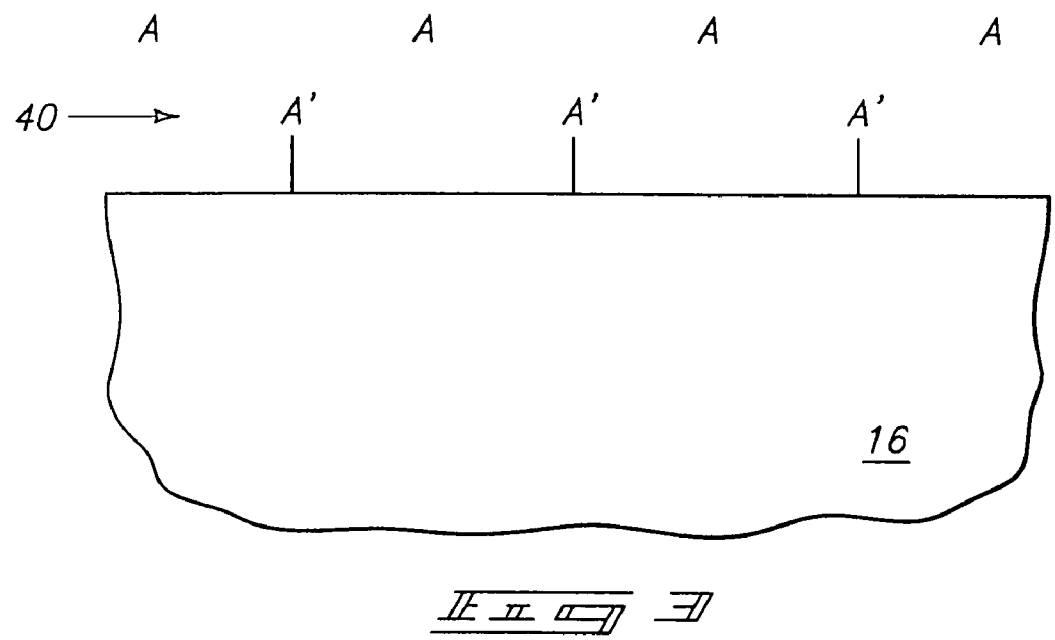
FIG. 3 is a diagrammatic depiction of a substrate in process in accordance with an aspect of the invention.

Referring to FIGS. 1 and 3, an exemplary first species A' is chemisorbed to form a first species monolayer 40 onto substrate 16 within deposition chamber 12 from a gaseous first precursor designated, by way of example only, as "A". The outer surface of substrate 16 upon which the first species monolayer is formed could constitute any suitable substrate, whether existing or yet-to-be developed, for example already having an oxide thereon or over which a conductive or insulative oxide might be deposited. In one exemplary embodiment, an exemplary gaseous first precursor comprises a metal organic, with one specific example being the trimethyl aluminum referred to above. By way of example only, FIG. 3 depicts first species monolayer A' resulting from chemisorption of gaseous first precursor A to substrate 16. Such gaseous first precursor can be considered, as exemplified diagrammatically in FIGS. 1 and 2, as coming from streams $P_1$ and/or $P_2$.

Figure 4:
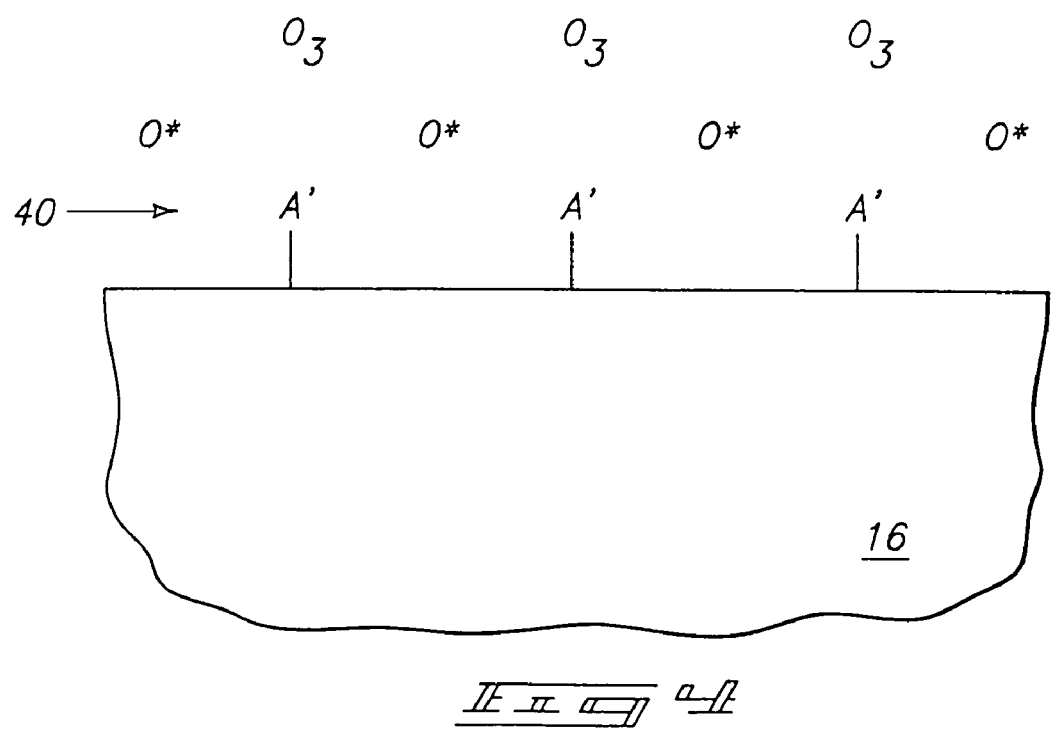
FIG. 4 is a view of the FIG. 3 substrate at a processing step subsequent to that depicted by FIG. 3.

Referring to FIGS. 4 and 5, the chemisorbed first species A' is contacted with a gaseous second precursor effective to react with the first species to form an oxide of a component of first species monolayer 40, and which by way of example only is designated as AO in FIG. 5. FIG. 4 depicts the contacting at least in part resulting from flowing $O_3$ to the deposition chamber. In one implementation, the stream feeding from the ozone generator comprises a mixture of $O_2$ and $O_3$ (by way of example only, 13 weight percent $O_3$ and 87 weight percent $O_2$ resulting from feeding 100% $O_2$ to the ozone generator). In one implementation, the $O_3$ is at a temperature of at least 170° C. at a location where it is emitted into deposition chamber 12 (location 45 in FIGS. 1 and 2). This is understood to be contrary to the prior art which feeds $O_3$ to the chamber at temperatures under 50° C. Additional preferred exemplary $O_3$ temperatures at the location where it is emitted into deposition chamber 12 include temperatures of at least 200° C., at least 300° C., at least 350° C. and at least 430° C. Further preferably, the $O_3$ is at a temperature of no greater than 600° C. at the location where it is emitted into the deposition chamber. Without necessarily being limited by any theory of the invention unless literally appearing in a claim under analysis, FIG. 4 depicts a perceived theory of invention whereby the $O_3$ forms O* proximate the substrate (FIG. 4) which reacts with the chemisorbed first species to form the oxide AO (FIG. 5). In one preferred embodiment, the $O_3$ is at a temperature at the location where it is emitted into the deposition chamber which is greater than the first species monolayer temperature on the substrate during the contacting.

Regardless, the chemisorbing and the contacting are successively repeated to form an oxide comprising layer on the substrate. FIG. 6 diagrammatically depicts an oxide comprising layer 50 formed of two monolayers 52, 54. Of course, more monolayers and a thicker oxide layer 50 are contemplated, depending on the thickness desired by the fabricator.

In one preferred implementation, the substrate heater is at a temperature of at least 350° C. during the contacting from feeding the gaseous second precursor, and more preferably at a temperature of at least 400° C., with a temperature of at least 430° C. being even more preferred. Further preferably, at least one wall heater for chamber walls 18, 20 and 22 is set to provide a wall temperature of at least 300° C. during the contacting from flowing the gaseous second precursor. Most preferably, at least the lid heat source for heating lid 22 operates to heat the lid to a temperature of at least 300° C., more preferably to a temperature of at least 350° C., and even more preferably to a temperature of at least 430° C.

The invention also contemplates atomic layer deposition methods of forming an oxide comprising layer on a substrate independent of $O_3$ flowing to the deposition chamber at a temperature of at least 170° C. at a location where it is emitted into the deposition chamber. In one such exemplary preferred embodiment, the chemisorbed first species is contacted with a gaseous second precursor at least in part resulting from flowing $O_3$ to the deposition chamber wherein O* is formed proximate the substrate, with the O* being at a temperature which is greater than that of the first species monolayer on the substrate to react therewith to form an oxide of a component of the first species monolayer. Preferably, the O* proximate the substrate is at a temperature which is at least 25° C., more preferably at least 500, more preferably at least 75° C., and even more preferably at least 100° C., greater than that of the first species monolayer on the substrate during the contacting. In one exemplary embodiment, a preferred temperature range for the O* proximate the substrate is at a temperature which is from 25° C. to 150° C. greater than that of the first species monolayer on the substrate during the contacting.

Yet another implementation is contemplated independent of $O_3$ being at a temperature of at least 170° C. at a location where it is emitted into the deposition chamber. For example, while elevated $O_3$ temperature at the surface is desired, such might be achieved or accomplished by feeding $O_3$ to the chamber at a temperature less than 170° C. at a location where it is emitted into the deposition chamber if the substrate heater is at a temperature of at least 350° C. and at least one wall heater is heated to a temperature of at least 350° C. during the contacting. More preferably, the substrate heater is at a temperature of at least 400° C., and even more preferably at a temperature of at least 430° C. during the contacting. Further more preferably, the at least one wall heater is also at a temperature of at least 400° C., and even more preferably at a temperature of at least 430° C. during the contacting. A preferred heated wall comprises the lid.

Flow rates, temperatures, pressures, purge gas flows, etc. can be optimized by the artisan, with no particular combination necessarily understood to be preferred, and to be largely dependent upon the equipment utilized and the precursors and oxide comprised layer being formed.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. An atomic layer deposition method of forming an oxide-comprising layer on a substrate, comprising:
    positioning a substrate within a deposition chamber;
    chemisorbing a first species to form a first species monolayer onto the substrate within the deposition chamber from a gaseous first precursor;
    contacting the chemisorbed first species with a gaseous second precursor effective to react with the first species to form an oxide of a component of the first species monolayer, the contacting at least in part resulting from flowing $O_3$ to the deposition chamber, the $O_3$ forming O* proximate the substrate which reacts with the chemisorbed first species to form the oxide, the O* proximate the substrate being at a temperature which is greater than that of the first species monolayer on the substrate; and
    successively repeating the chemisorbing and the contacting to form an oxide-comprising layer on the substrate.

2. The method of claim 1 wherein the O* proximate the substrate is at a temperature which is at least 25° C. greater than that of the first species monolayer on the substrate.

3. The method of claim 1 wherein the O* proximate the substrate is at a temperature which is at least 50° C. greater than that of the first species monolayer on the substrate.

4. The method of claim 1 wherein the O* proximate the substrate is at a temperature which is at least 75° C. greater than that of the first species monolayer on the substrate.

5. The method of claim 1 wherein the O* proximate the substrate is at a temperature which is at least 100° C. greater than that of the first species monolayer on the substrate.

6. The method of claim 1 wherein the O* proximate the substrate is at a temperature which is from 25° C. to 150° C. greater than that of the first species monolayer on the substrate.

7. The method of claim 1 wherein the deposition chamber comprises a lid heat source, the contacting occurring while the lid heat source is heated to a temperature of at least 300° C.

8. The method of claim 1 wherein the deposition chamber comprises a lid heat source, the contacting occurring while the lid heat source is heated to a temperature of at least 400° C.

9. The method of claim 1 wherein the contacting at least in part results from flowing a mixture of $O_2$ and $O_3$ to the deposition chamber.

10. The method of claim 1 wherein the gaseous first precursor comprises trimethyl aluminum, and the oxide comprises aluminum oxide.

11. The method of claim 1 wherein the $O_3$ is at a temperature of at least 170° C. at a location where it is emitted into the deposition chamber.

12. An atomic layer deposition method of forming an oxide-comprising layer on a substrate, comprising:
    positioning a substrate within a deposition chamber, the deposition chamber comprising a substrate heater and at least one chamber wall heater;
    chemisorbing a first species to form a first species monolayer onto the substrate within the deposition chamber from a gaseous first precursor;
    contacting the chemisorbed first species with a gaseous second precursor effective to react with the first species to form an oxide of a component of the first species monolayer, the contacting at least in part resulting from flowing $O_3$ to the deposition chamber, the substrate heater being at a temperature of at least 350° C. and the at least one wall heater being at a temperature of at least 350° C. during the contacting; and
    successively repeating the chemisorbing and the contacting to form an oxide-comprising layer on the substrate.

13. The method of claim 12 wherein the substrate heater is at a temperature of at least 400° C. and the at least one wall heater being at a temperature of at least 400° C. during the contacting.

14. The method of claim 12 wherein the substrate heater is at a temperature of at least 430° C. and the at least one wall heater being at a temperature of at least 430° C. during the contacting.

15. The method of claim 12 wherein the at least one wall heater comprises a lid heated to at least 350° C.

16. The method of claim 12 wherein the $O_3$ is at a temperature of at least 170° C. at a location where it is emitted into the deposition chamber.

* * * * *